United States Patent [19]
Nazari

[11] Patent Number: 5,455,785
[45] Date of Patent: Oct. 3, 1995

[54] MANY TIME PROGRAMMABLE MEMORY CARD WITH ULTRAVIOLET ERASABLE MEMORY

[75] Inventor: Amir Nazari, Sunnyvale, Calif.

[73] Assignee: National Semiconductor Corporation, Santa Clara, Calif.

[21] Appl. No.: 213,626

[22] Filed: Mar. 15, 1994

[51] Int. Cl.[6] .................................................. G11C 7/02
[52] U.S. Cl. .................................. 365/53; 365/52; 365/94; 365/218; 365/185.32; 257/681
[58] Field of Search .................................. 365/51, 52, 53, 365/94, 218, 900; 257/681

[56] References Cited

FOREIGN PATENT DOCUMENTS 0452047  10/1991  European Pat. Off. .................. 365/94
0245597  10/1987  Japan ........................................ 365/52

OTHER PUBLICATIONS

IBM Technical Disclosure Bulletin, vol. 27 No. 12 May 1985, pp. 6937–6938.

Primary Examiner—Joseph A. Popek
Assistant Examiner—F. Niranjan
Attorney, Agent, or Firm—Limbach & Limbach

[57] ABSTRACT

A memory card includes a circuit board bearing UV-erasable memory circuits enclosed in an opaque cover. The cover is provided with openings over the memory circuits. These openings can be covered or uncovered by a removable, opaque window shield. The memory card may be erased by removing the window shield from the openings in the cover and exposing the memory circuits to ultraviolet radiation transmitted through the openings. The window shield is then replaced to the position covering the openings in the cover after the erasable memory circuits are reprogrammed.

11 Claims, 4 Drawing Sheets

MANY TIME PROGRAMMABLE MEMORY CARD WITH ULTRAVIOLET ERASABLE MEMORY

BACKGROUND OF THE INVENTION

1. Field of the Invention

The present invention relates to memory cards, such as PC cards. A memory card includes board-mounted, packaged memory chips or surface-mounted memory chips (chip on board mounting) which are usually enclosed in a sealed, opaque package. The Personal Computer Memory Chip International Association (hereinafter PCMCIA) has set widely-used, standard specifications for PC cards.

Memory cards store data and can be interfaced for retrieval of that data by personal computers and other devices containing computers, such as telephone facsimile devices.

2. Background Art

One type of memory card is the One Time Programmable (hereinafter OTP) card. An OTP cards utilizes PROM memory chips and usually enclosed in a sealed cover. Once data is written to the PROM memory of an OTP card, the data cannot be erased and the card cannot be reprogrammed. Therefore, if the information in the PROM memory becomes obsolete for any reason, such as unforeseen compatibility problems or updates to the data, the OTP memory card must be discarded for a new memory card.

Another type of memory card is the Flash card. This type of memory card relies on flash EPROM devices that can be erased electronically upwards of 10,000 times through the computer interface of the Flash card. This allows a single Flash card to be reprogrammed many times for purposes such as applying an old card to a new application or debugging.

Flash cards, however, require more transistors per unit of memory storage. For this reason, Flash cards have a smaller capacity than a comparably sized OTP card. Also, the complexity of Flash card hardware can drive up the price.

Therefore, there is a need for an erasable and reprogrammable memory card with a simplified memory construction and high data storage capacity.

SUMMARY OF THE INVENTION

It is an object of the present invention to provide a relatively inexpensive, high-density memory card which is erasable and reprogrammable utilizing conventional memory circuits such as standard EPROM memory circuits.

In accordance with the present invention, the surface of a circuit board that holds UV-erasable memory circuits is covered with an opaque top cover which has openings disposed over the memory circuits. These openings may be filled with a material, such as quartz glass, which is translucent with respect to ultraviolet light. A removable, opaque window shield, which can be placed in a position covering the openings, is also provided. Thus, the memory circuits can be erased by removing the window shield and exposing the memory circuits to ultraviolet radiation through the openings in the cover. The window shield can then be replaced to protect the memory circuits from ultraviolet radiation so that the memory circuits may be reprogrammed until erasure is again desired.

A better understanding of the features and advantages of the present invention will be obtained by reference to the following detailed description and accompanying drawings which sets forth illustrative embodiments in which the principles of the invention are utilized.

DETAILED DESCRIPTION OF THE INVENTION

Figure 1:
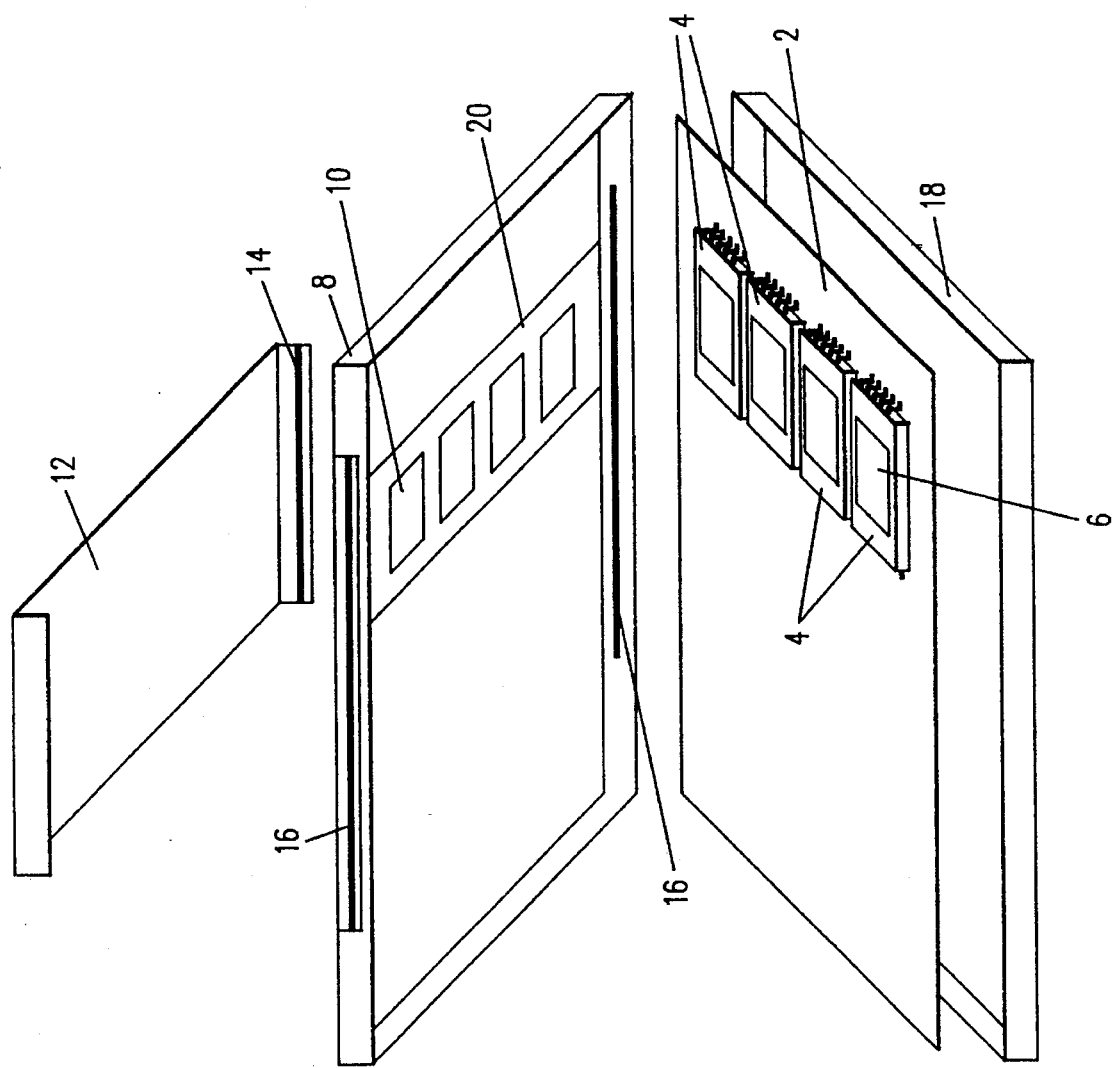
FIG. 1 is an exploded perspective view illustrating an embodiment of a memory card according to the present invention.

FIG. 1 shows four UV-erasable memory chips 4 mounted on a circuit board 2. Each UV-erasable memory chip 4 is enclosed in a package that includes a quartz window 6 formed on its top surface, as shown in FIG. 1. The quartz window 6 allows the memory storage elements of the chip to be erased by exposure to ultraviolet radiation through the quartz window 6. UV-erasable chips may typically be successfully erased and reprogrammed upwards of 100 times. The memory chips 4 may be comprised of Erasable Programmable Read Only Memory (EPROM) chips packaged as, for example, windowed Small Outline Package (SOP) chips or windowed Ceramic Leadless Chip Carrier (CCLC) chips.

As further shown in FIG. 1, a top cover 8 is placed over the circuit board 2 in order to protect any additional functional or interconnect circuitry on the circuit board from mechanical shock, environmental contamination (such as moisture) and harmful radiation (such as ultraviolet radiation). The top cover 8 is preferably comprised of metal (e.g. stainless steel) or high density plastic to provide desired strength, resilience and opaqueness.

The top cover 8 includes openings 10 formed over each memory chip 4. These openings 10 are covered by a removable window shield 12 which is opaque to ultraviolet light. The window shield 12 is typically made of the same metal or high density plastic as the top cover 8.

In the FIG. 1 embodiment, the window shield 12 mates with the top cover 8 in a position where the window shield 12 completely covers the openings 10. The window shield 12 should be capable of being stably positioned, or locked, into this position in order to prevent accidental removal of the window shield 12 and consequent accidental exposure of the memory chips 4 to ultraviolet radiation. However, the window shield 12 should be removable from the position covering the openings 10 in order to allow erasure of the memory chips 4 when desired.

The embodiment of FIG. 1 shows a locking tongue 14 and groove 16 arrangement. In this embodiment, the window shield 12 slides along the major surface of the top cover 8 in a direction away from the openings 10 by applying sufficient force to the window shield 12. When the window shield 12 is removed from the position covering the openings 10 to allow UV-erasure of the memory chips 4, it remains attached to the top cover 8 by means of the tongue 14 and groove 16 mating. The window shield 12 may be slid and locked back into the position covering the openings 10 when erasure is complete. This allows the memory chips 4 to be stably reprogrammed through the memory card interface (not shown).

The top cover 8 is sealably mated with a bottom cover 18. Again, the bottom cover 18 helps protect the circuit board 2 and the memory chips 4 from mechanical shock and environmental contamination. The bottom cover 18 is typically made of the same metal or high density plastic as the top cover 8 and the window shield 12. The top cover 8 and bottom cover 18 assembly may be preferably chosen to meet PCMCIA physical and electrical standards in order to promote wider application of the memory cards with devices utilizing PCMCIA standards.

The memory card also contains a board sealing pad 20 placed between the openings 10 and the memory chips 4. This board sealing pad 20 comprises a thin, flexible material, such as plastic foam or rubber. The board sealing pad 20 provides a seal between the edges of the openings 10 and the top surfaces of the memory chips 4. This seal helps to protect the circuit board and the memory circuits from environmental contamination and mechanical shock. In some cases, it may be desirable to fix the board sealing pad 20 to the top cover 8 using adhesives.

The FIG. 2 embodiment of the invention includes a circuit board 102, a top cover 108, a window shield 112 and a bottom cover 118 similar to those explained in connection with the FIG. 1 embodiment. However, in contrast to the packaged EPROM devices utilized in the FIG. 1 embodiment, the embodiment of FIG. 2 employs unpackaged UV-erasable surface-mounted chips 104 that are mounted directly on the surface of the circuit board 102 (i.e. chip on board mounting). As stated above, the memory chips 104 can typically be erased and reprogrammed successfully upwards of 100 times. Since the surface-mounted memory chips 104 lack the durability of packaged EPROM chips, the openings over the memory chips 104 should be filled to protect them from mechanical shock and environmental contamination. However, the openings must be filled with a material translucent to ultraviolet radiation in order to allow erasure when desired. Quartz glass is an example of an appropriate material for filling the openings. Note that the term "translucent" is employed herein to include materials which are transparent.

Figure 2:
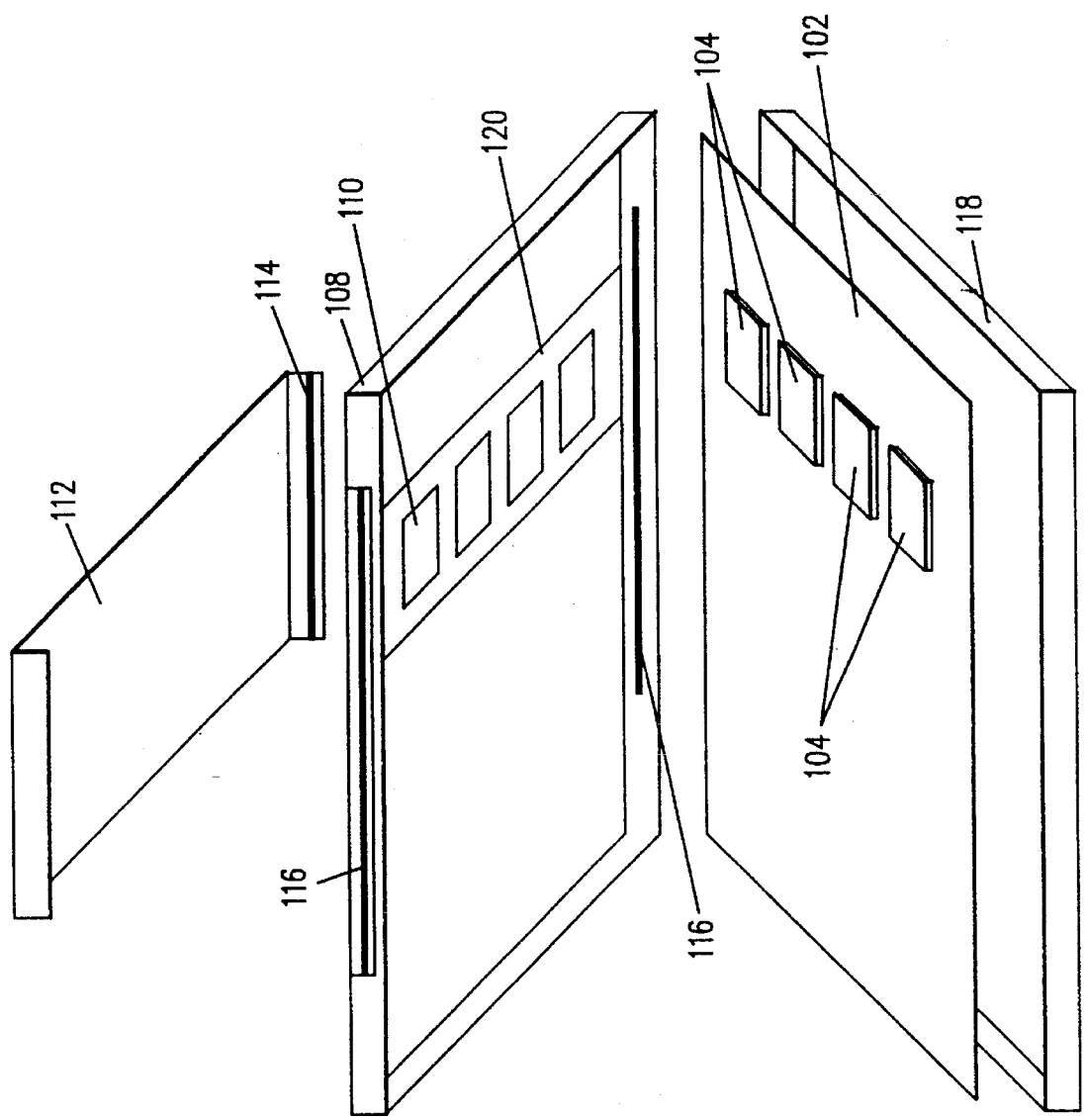
FIG. 2 is an exploded perspective view illustrating a second embodiment of a memory card according to the present invention.

The embodiment shown in FIG. 2 employs quartz glass windows 110 to fill the openings in the top cover 108. It is preferable that the windows 110 are sealed as tightly as possible with the edges of the openings to prevent environmental contamination to the circuit board 102 and memory chips 104. The seal between the windows 110 and the edges of the openings may be further assured by employing a board sealing pad 120. The board sealing pad 120 is comprised of a thin, flexible material, such as, for example, plastic foam or rubber. The board sealing pad 120 can be placed over or underneath the edges of the openings and is held in place by adhesives (not shown).

Figure 3:
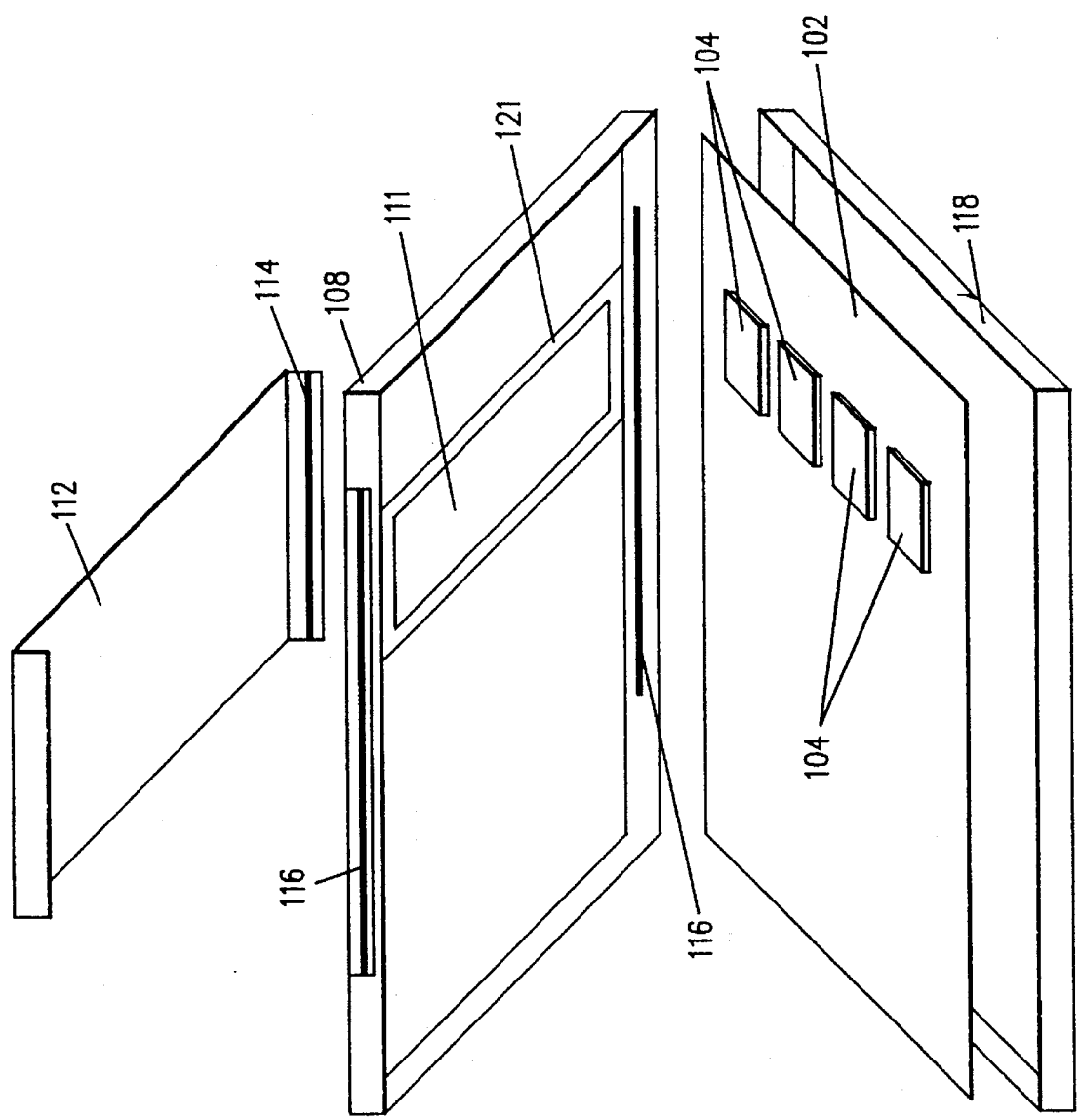
FIG. 3 is an exploded perspective view illustrating a third embodiment of a memory card according to the present invention.

FIG. 3 shows an embodiment of the invention which is similar to the embodiment of FIG. 2 except that the opening in the top cover and window 111 has a different shape and the board sealing pad 121 has a different profile. That is, the FIG. 3 embodiment provides a single opening and window 111 of sufficient size to cover all of the memory chips 104 instead of separate openings and windows 110 for each memory chip 104, as shown in FIG. 2. In some applications, the embodiment of FIG. 3 may provide lower manufacturing cost relative to the embodiment of FIG. 2 due to the simplified shape of window 111 and board sealing pad 121.

Figure 4:
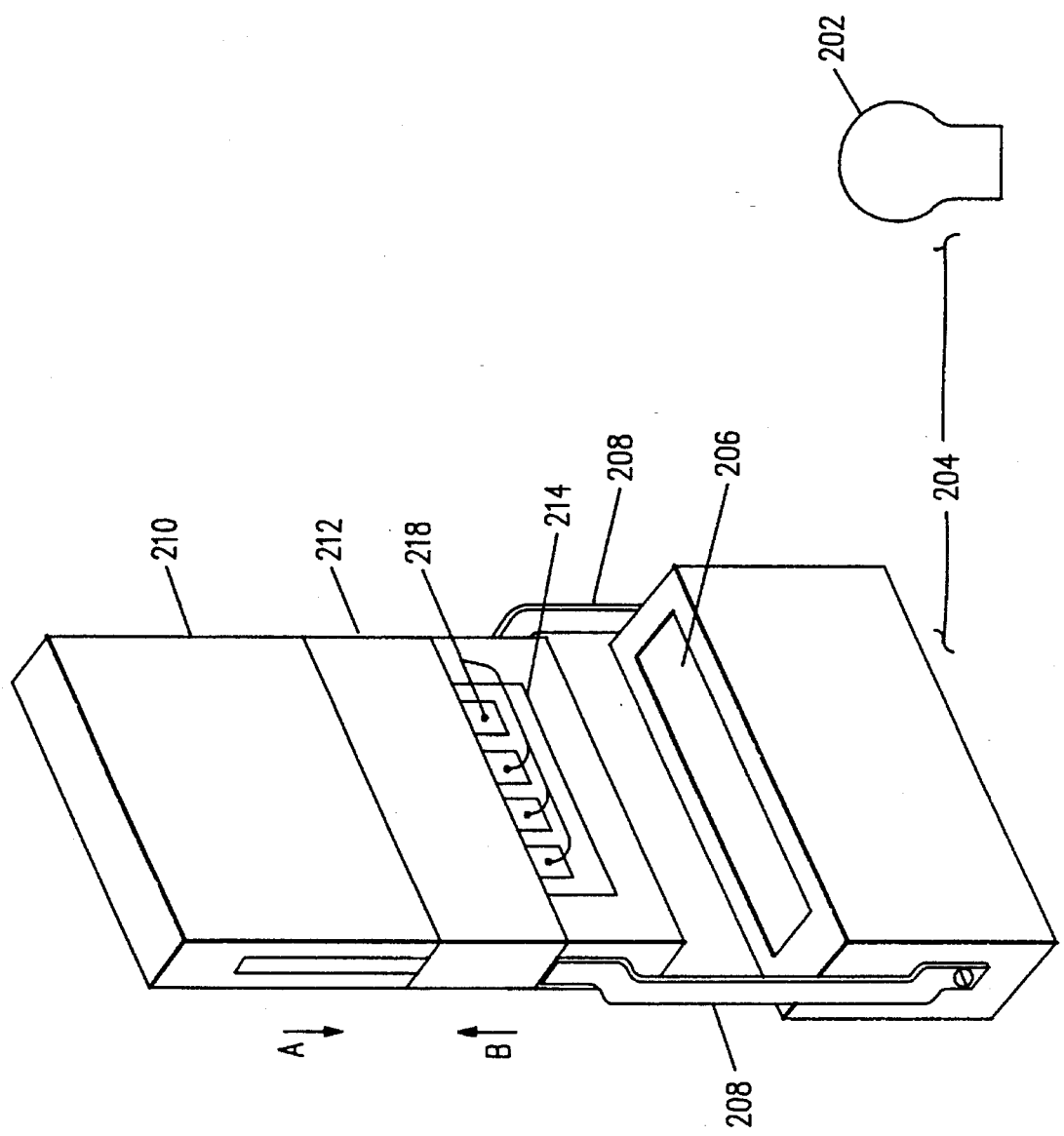
FIG. 4 is a perspective view illustrating a fourth embodiment of a memory card according to the present invention.

FIG. 4 shows an embodiment of a memory card which includes means for erasure and reprogramming of the memory card. As shown in FIG. 4, the cover assembly 210 encloses a circuit board (not shown) and memory circuits 218 of a type described above. The cover assembly 210 mates with a window shield 212 using a locking tongue and groove also as explained above. Initially the window shield 212 is locked in a position covering the opening 214 in the cover assembly 210.

When erasure and reprogramming of the memory card is desired, the cover assembly 210 is slid into a memory card eraser 204. The memory card eraser 204 includes an ultraviolet radiation source 202 which can be switched on or off. The ultraviolet radiation source 202 is located so that radiation from the ultraviolet radiation source 202 will be incident on the opening 214 when the cover assembly is placed in the memory card eraser 204. The memory card also includes a memory card slot 206, such as a PCMCIA Interface slot, upon which is mounted a window shield stop 208. The window shield stop 208 is formed as a pair of arms extended from the memory card slot 206. If the memory card is constructed according to PCMCIA standards, then a commercially available, standard PCMCIA memory card slot can be used as the memory card slot 206.

In order to erase and reprogram the memory card, the cover assembly 210 is moved toward the memory card slot 206 in the direction shown by arrow A in FIG. 4. The window shield stop 208 will come into contact with the window shield 212 as shown in FIG. 4. As the cover assembly is moved closer to the memory card slot 206, the window shield 212 will move, in the direction of arrow B relative to the cover assembly 210, out of the locked position over the opening 214 in response to force applied through the window shield stop 208.

When the cover assembly 210 is moved into a position properly engaging with the memory card slot 206, the window shield 212 will be in a position away from the opening 214 in the cover assembly. The ultraviolet radiation source 202 may then be turned on to erase the memory circuits 218. When erasure is completed, the ultraviolet radiation source 202 may be switched off and the memory circuits 218 can be reprogrammed through the interface with the memory card slot 206.

After reprogramming is complete, the cover assembly 210 may be slid away from the memory card slot 206 in the direction of arrow B. As the cover assembly is moved in this direction, the window shield 212 will be free to move back to a locked position covering the opening 214 in the cover assembly 210. It may be helpful to bias the window shield 212 toward a position covering the opening 214 by means of springs or the like in order to insure that the window shield 212 does in fact move back into the position covering the opening 214.

One possible modification possible from the above described embodiments is that the window shield may be made detachable from the top cover.

Another possible modification from the above described embodiments is that the window shield may be placed between the top cover and memory circuits. In this case, there must be some means of accessing the window shield through the top or bottom covers so that the window shield can be removed from the position covering the opening in the top cover when desired.

It is to be understood that the present invention is not limited to the above described embodiments, and that various changes and modifications could be effected by one skilled in the art without departing from the spirit or scope of the invention as defined in the appended claims.

What is claimed is:

1. A memory card comprising:

a circuit board;

a memory circuit, erasable by exposure to ultraviolet radiation, disposed on a first surface of the circuit board;

a top cover, opaque with respect to ultraviolet radiation, disposed over the first surface of the circuit board, the top cover having an opening formed therein and disposed over the memory circuit;

a window shield, opaque with respect to ultraviolet radiation, which is removably disposed in a position covering the opening in the top cover; and a board sealing pad disposed between edges of the opening in the top cover and the memory circuit;

whereby the memory circuit may be erased by removing the window shield from the position covering the opening in the top cover to thereby expose the memory circuit to ultraviolet radiation without exposing the first surface of the circuit board to ultraviolet radiation.

2. A memory card comprising:

a circuit board;

a memory circuit, erasable by exposure to ultraviolet radiation, disposed on a first surface of the circuit board;

a top cover, opaque with respect to ultraviolet radiation, disposed over the first surface of the circuit board, the top cover having an opening formed therein and disposed over the memory circuit; and a window shield, opaque with respect to ultraviolet radiation, which is removably disposed in a position covering the opening in the top cover;

wherein the memory circuit comprises a plurality of EPROM memory chips; and whereby the memory circuit may be erased by removing the window shield from the position covering the opening in the top cover to thereby expose the memory circuit to ultraviolet radiation without exposing the first surface of the circuit board to ultraviolet radiation.

3. A memory card comprising:

a circuit board;

a memory circuit, erasable by exposure to ultraviolet radiation, disposed on a first surface of the circuit board;

a top cover, opaque with respect to ultraviolet radiation, disposed over the first surface of the circuit board, the top cover having an opening formed therein and disposed over the memory circuit;

a window shield, opaque with respect to ultraviolet radiation, which is removably disposed in a position covering the opening in the top cover;

a bottom cover, which sealably mates with the top cover, with the circuit board and the memory circuit being enclosed by the top cover and the bottom cover; and a window translucent with respect to ultraviolet radiation disposed within the opening in the top cover;

whereby the memory circuit may be erased by removing the window shield from the position covering the opening in the top cover to thereby expose the memory circuit to ultraviolet radiation without exposing the first surface of the circuit board to ultraviolet radiation.

4. The memory card of claim 3 wherein the window shield slidably mates with the top cover such that the window shield is slidable between a first position covering the window and a second position such that the window is not covered.

5. The memory card of claim 3 wherein the memory circuit comprises a surface-mounted EPROM memory chip.

6. The memory card of claim 3 wherein the memory card is a PCMCIA standard PC card.

7. The memory card of claim 6 further comprising a detachable memory card eraser, the detachable memory card eraser comprising:

an ultraviolet radiation source;

a memory card interface slot which slidably mates with the top and bottom covers;

a window shield stop attached to the memory card interface slot which comes into interfering contact with the window shield as the top and bottom covers are slid into the memory card interface slot such that the interfering contact between the window shield stop and the window shield causes the window shield to slide from the first position covering the window in the top cover to the second position not covering the window, and wherein the ultraviolet radiation source is positioned to illuminate the openings in the top cover.

8. The memory card of claim 7 wherein the window shield stop comprises a pair of arms extended from the memory card interface slot.

9. The memory card of claim 7 wherein the memory card interface slot comprises a PCMCIA standard interface slot.

10. The memory card of claim 3 further comprising a board sealing pad attached to a surface of the top cover and the window such that the board sealing pad provides a seal between the top cover and the window.

11. A method for erasing a memory card comprising:

uncovering an opening in a memory card cover by removing a window shield which is opaque with respect to ultraviolet radiation by sliding the memory card into a memory card interface slot such that a window shield stop attached to the memory card interface slot forces the window shield away from the opening in the memory card cover as the memory card is slid into the memory card interface slot, the opening being translucent with respect to ultraviolet radiation and being disposed over a memory circuit, inside the memory card cover;

exposing the opening in the memory card cover to ultraviolet radiation to erase the memory circuit; and replacing the window shield to the position covering the opening in the memory card cover when the memory card is slid out of the memory card interface slot, and away from the attached window shield stop, thereby allowing the window shield to return to the position covering the opening in the memory card cover.

* * * * *